(12) United States Patent  
Anderson et al.

(10) Patent No.: US 7,368,354 B2  
(45) Date of Patent: May 6, 2008

(54) PLANAR SUBSTRATE DEVICES INTEGRATED WITH FINFETS AND METHOD OF MANUFACTURE

(75) Inventors: Brent A. Anderson, Jericho, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 303 days.

(21) Appl. No.: 11/200,271

(22) Filed: Aug. 9, 2005

(65) Prior Publication Data  
US 2006/0084212 A1    Apr. 20, 2006

Related U.S. Application Data

(62) Division of application No. 10/711,974, filed on Oct. 18, 2004, now Pat. No. 6,949,768.

(51) Int. Cl.  
*H01L 21/00* (2006.01)  
*H01L 21/84* (2006.01)  
*H01L 21/8238* (2006.01)  
*H01L 21/336* (2006.01)

(52) U.S. Cl. .............. 438/283; 438/157; 438/228; 257/E21.014

(58) Field of Classification Search .......... 438/157, 438/228, 283; 257/E21.014  
See application file for complete search history.

(56) References Cited

U.S. PATENT DOCUMENTS

| | | | |
|---|---|---|---|
| 6,252,284 B1 | 6/2001 | Muller et al. | |
| 6,770,516 B2 | 8/2004 | Wu et al. | |
| 7,074,623 B2* | 7/2006 | Lochtefeld et al. | 438/3 |
| 2003/0141569 A1 | 7/2003 | Fried et al. | |
| 2003/0193058 A1 | 10/2003 | Fried et al. | |
| 2004/0108559 A1 | 6/2004 | Sugii et al. | |
| 2005/0003592 A1* | 1/2005 | Jones | 438/157 |

* cited by examiner

*Primary Examiner*—Scott B. Geyer  
*Assistant Examiner*—Seahvosh Nikmanesh  
(74) *Attorney, Agent, or Firm*—Gibb & Rahman, LLC; William D. Sabo, Esq.

(57) ABSTRACT

A planar substrate device integrated with fin field effect transistors (FinFETs) and a method of manufacture comprises a silicon-on-insulator (SOI) wafer comprising a substrate; a buried insulator layer over the substrate; and a semiconductor layer over the buried insulator layer. The structure further comprises a FinFET over the buried insulator layer and a field effect transistor (FET) integrated in the substrate, wherein the FET gate is planar to the FinFET gate. The structure further comprises retrograde well regions configured in the substrate. In one embodiment, the structure further comprises a shallow trench isolation region configured in the substrate.

20 Claims, 8 Drawing Sheets

US 7,368,354 B2

PLANAR SUBSTRATE DEVICES INTEGRATED WITH FINFETS AND METHOD OF MANUFACTURE

CROSS-REFERENCE TO RELATED APPLICATIONS

This Application is a division of U.S. patent application Ser. No. 10/711,974, filed Oct. 18, 2004, now U.S. Pat. No. 6,949,768 hereby incorporated by reference.

BACKGROUND OF THE INVENTION

1. Field of the Invention

The embodiments of the invention generally relate to microelectronic logic devices and methods of fabrication and more particularly to the design and manufacturing of integrated circuit devices having improved device performance characteristics and improved manufacturing methods.

2. Description of the Related Art

As integrated circuits (ICs) continue to develop and enhance, the number and density of the devices being formed on IC substrates has increased tremendously with the fabrication of ICs having hundreds of millions and approaching billions of devices on a chip being standard in the industry. In conjunction with this increase in the number of devices formed on an IC substrate and the concurrent increase in density of the devices, the dimensions of the devices have dropped significantly. For example, the dimensions of gate thicknesses and channel separation of source and drain elements continues to be minimized such that today, micrometer and nanometer separations of the source, drain, and gate are required. While devices have been steadily reducing in size, the performance of the devices must also be continually maintained or improved. Furthermore, the ease and cost effectiveness with which these ICs are manufactured should also improve.

The integration of planar IC devices with fin field effect transistors silicon-on-insulator complementary metal oxide semiconductor (FinFET SOI CMOS) devices have some advantages for electrostatic discharge (ESD) and analog applications and for the use of existing designs. Conventional techniques of performing this integration include placing the FET gate on top of SOI islands. However, this generally tends to result in large height differences between the FinFET gates and the gates over the planar logic (i.e., the FET gates). As such, this step height difference is a significant problem for lithography and etching and requires several additional manufacturing steps to ameliorate the problem, which tends to increase the overall manufacturing cost. Therefore, there remains a need for a novel method and structure, which provides superior IC device performance while simultaneously achieving ease of fabrication and reduction in manufacturing cost.

SUMMARY OF THE INVENTION

In view of the foregoing, an embodiment of the invention provides a structure comprising a substrate; a buried isolation layer over the substrate; a fin field effect transistor (FinFET) over the buried isolation layer; and a field effect transistor (FET) integrated in the substrate, wherein a gate region of the FET is planar to a gate region of the FinFET. The structure further comprises retrograde well regions configured in the substrate. The FinFET comprises a semiconductor layer comprising sidewalls; a first dielectric layer over the semiconductor layer; a second dielectric layer configured along each of the sidewalls of the semiconductor layer; the FinFET gate region over the first and second dielectric layers; and FinFET source/drain regions on opposite sides of the FinFET gate region. The FET comprises FET source/drain regions on opposite sides of the FET gate region; and a gate dielectric layer between the FET gate region and the substrate. In one embodiment, the structure further comprises a shallow trench isolation (STI) region configured in the substrate.

Another aspect of the invention provides a structure comprising a silicon-on-insulator (SOI) wafer comprising a substrate; a buried insulator layer over the substrate; and a semiconductor layer over the buried insulator layer. The structure further comprises a FinFET over the buried insulator layer and a FET integrated in the substrate, wherein a gate region of the FET is planar to the gate region of the FinFET. The structure further comprises retrograde well regions configured in the substrate. The FinFET comprises sidewalls configured on the semiconductor layer; a first FinFET dielectric layer over the semiconductor layer; a second FinFET dielectric layer configured along each of the sidewalls of the semiconductor layer; the FinFET gate region over the first and second FinFET dielectric layers; and FinFET source/drain regions on opposite sides of the FinFET gate region. The FET comprises FET source/drain regions on opposite sides of the FET gate region; and a gate dielectric layer between the FET gate region and the substrate. In one embodiment, the buried insulator layer comprises buried oxide. Additionally, in another embodiment, the structure further comprises a STI region configured in the substrate.

Another embodiment of the invention provides a method of forming a planar substrate device integrated with a FinFET, wherein the method comprises providing a substrate; forming a buried isolation layer above the substrate; bonding a semiconductor layer to the buried isolation layer; simultaneously forming a FinFET over the buried isolation layer wherein the FinFET comprises a FinFET gate region and forming a FET in the substrate wherein the FET comprises a FET gate region; and planarizing the FinFET gate region and the FET gate region. The method further comprises configuring well regions in the substrate. The process of forming the FinFET comprises forming a first FinFET dielectric layer over the semiconductor layer, wherein the semiconductor layer comprises sidewalls; configuring a second FinFET dielectric layer along each of the sidewalls of the semiconductor layer and over the substrate; forming the FinFET gate region over the first and second FinFET dielectric layers; and forming FinFET source/drain regions on opposite sides of the FinFET gate region.

The process of forming the FET comprises forming a FET gate dielectric layer over the substrate; forming the FET gate region over the FET gate dielectric layer, wherein the FET gate dielectric layer is adjacent to the FET gate region; and forming FET source/drain regions in the substrate. Moreover, the FET gate dielectric layer is formed between the FET gate region and the substrate. In one embodiment of the invention, the method further comprises configuring a STI region in the substrate. Additionally, the FinFET gate region comprises polysilicon and the FET gate region comprises polysilicon. In one embodiment, the buried insulator layer comprises buried oxide.

The embodiments of the invention provide an easy to implement integration technique whereby the planar logic integrated circuit devices are incorporated with the FinFET devices and are formed such that the FET gate and FinFET gate are formed in one manufacturing step. For example, the deposition of the FET gate material and FinFET gate material occur at the same time, and the planarization of the FET gate material and FinFET gate material occur at the same time. The FET gate and FinFET gate are planarized to the same upper height, which obviates the need for additional lithography and etching processes, thereby reducing the number of manufacturing steps resulting in an overall reduction in manufacturing cost.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS OF THE INVENTION

Figure 1:
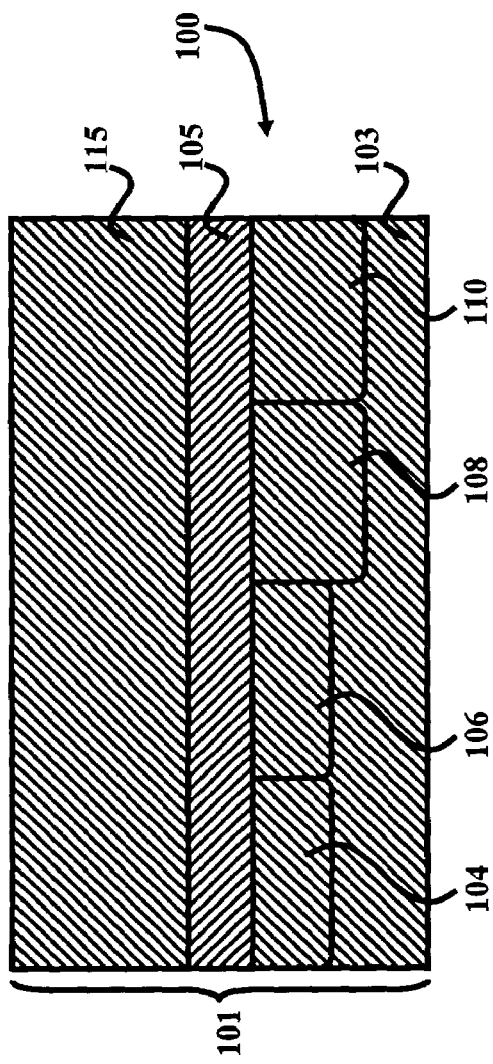
FIG. 1 is a cross-sectional view illustrating a first intermediate processing step of an integrated circuit device according to an embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned, there remains a need for a novel method and structure, which provides superior IC device performance while simultaneously achieving ease of fabrication and reduction in manufacturing cost. Generally, in order to address this need an embodiment of the invention provides a technique of removing the buried isolation regions where planar devices are desired; i.e., where the bulk logic FET devices in the integrated circuit are located. Referring now to the drawings, and more particularly to FIGS. 1 through 14 where similar reference characters denote corresponding features consistently throughout the figures, there are shown preferred embodiments of the invention.

Figure 9:
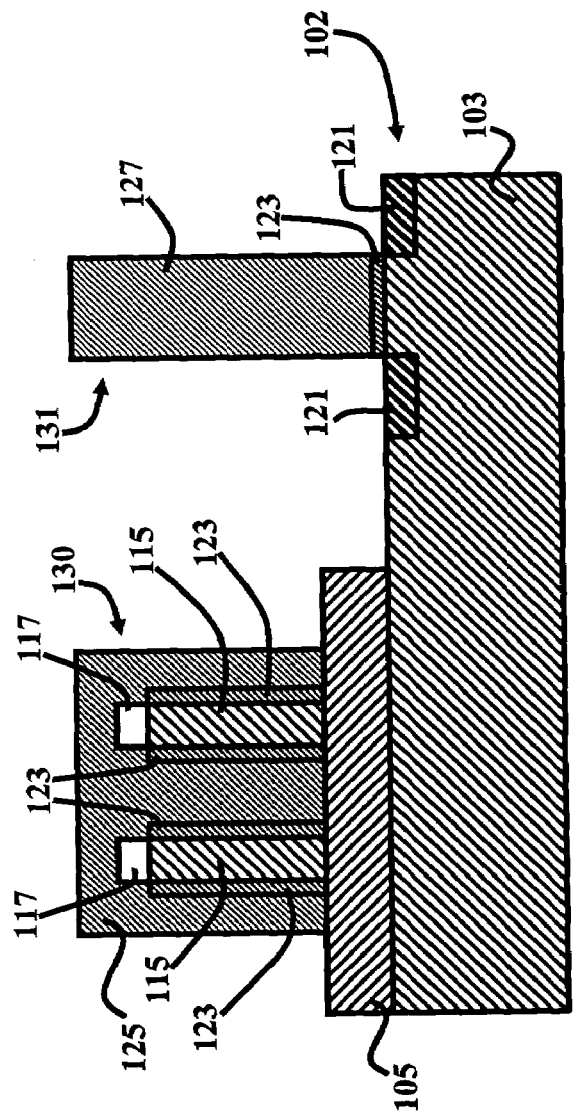
FIG. 9 is a cross-sectional view of a generally completed integrated circuit device according to a second embodiment of the invention.
Figure 10:
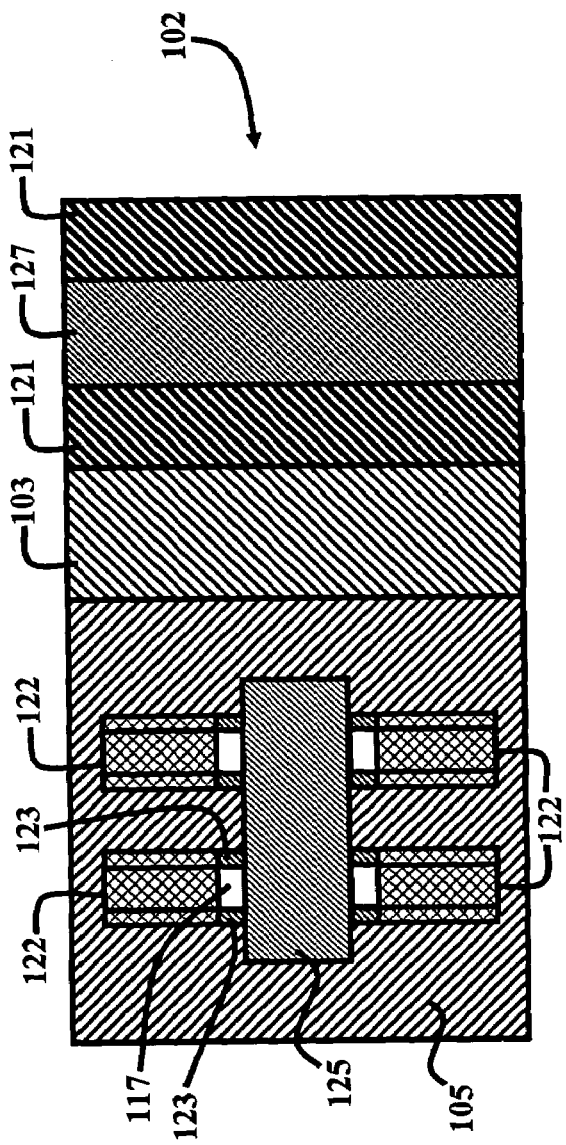
FIG. 10 is a top view of the generally completed integrated circuit device of FIG. 9 according to the second embodiment of the invention.
Figure 11:
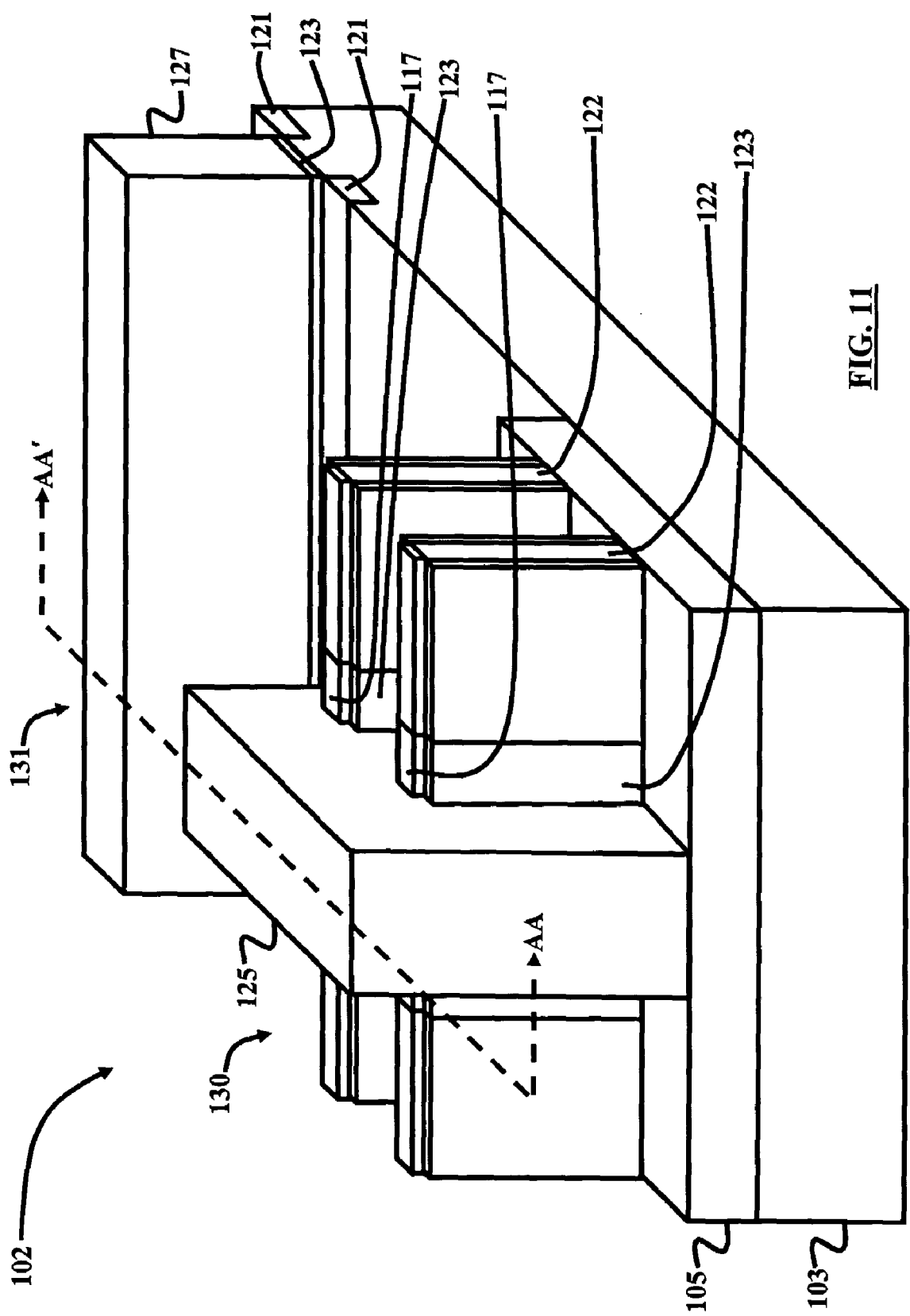
FIG. 11 is a perspective view of the generally completed integrated circuit device of FIGS. 9 and 10 according to the second embodiment of the invention.

The formation of an integrated circuit device 100, according to an embodiment of the invention, is illustrated in the generally sequential fabrication steps illustrated in FIGS. 1 through 8. An alternate embodiment of a generally completed device is illustrated in FIGS. 9 through 11, with an example of the general methodology flow illustrated in FIGS. 10 through 12. As shown in FIG. 1, a SOI wafer 101 is formed using well known techniques such as separation by implantation and oxidation (SIMOX) or by wafer bonding and etch-back, or other well known techniques generally used in the art. The SOI wafer 101 comprises a silicon layer 115 over a buried isolation layer 105 over a substrate 103. The buried isolation layer 105 comprises insulative materials; however any type of buried insulator other than buried oxide may be used as an alternative to the buried isolation layer 105. Preferably, the buried isolation layer 105 is very thin, approximately 20-2,000 Å.

Figure 2:
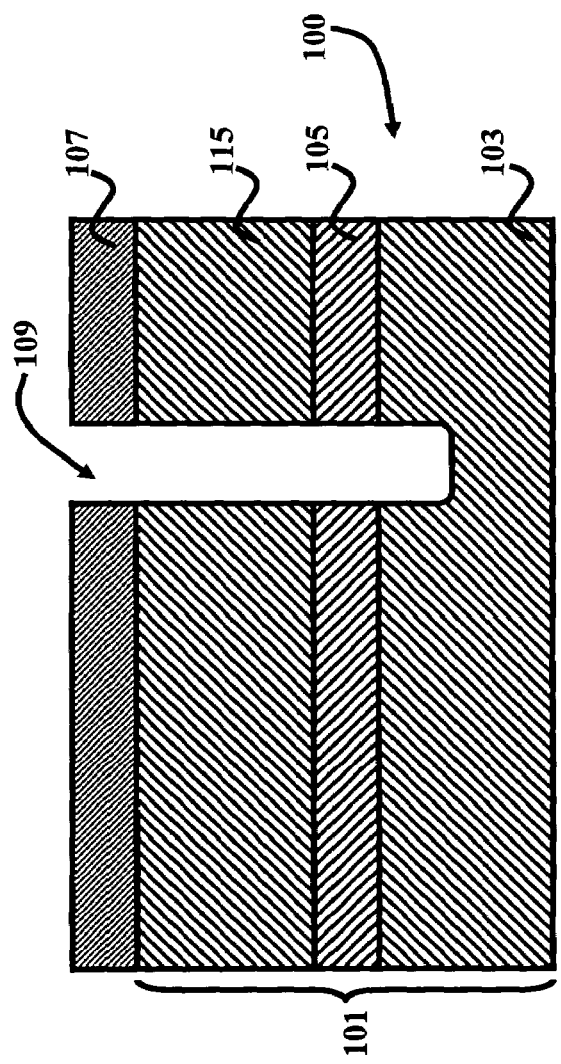
FIG. 2 is a cross-sectional view illustrating a second intermediate processing step of an integrated circuit device according to an embodiment of the invention.
Figure 3:
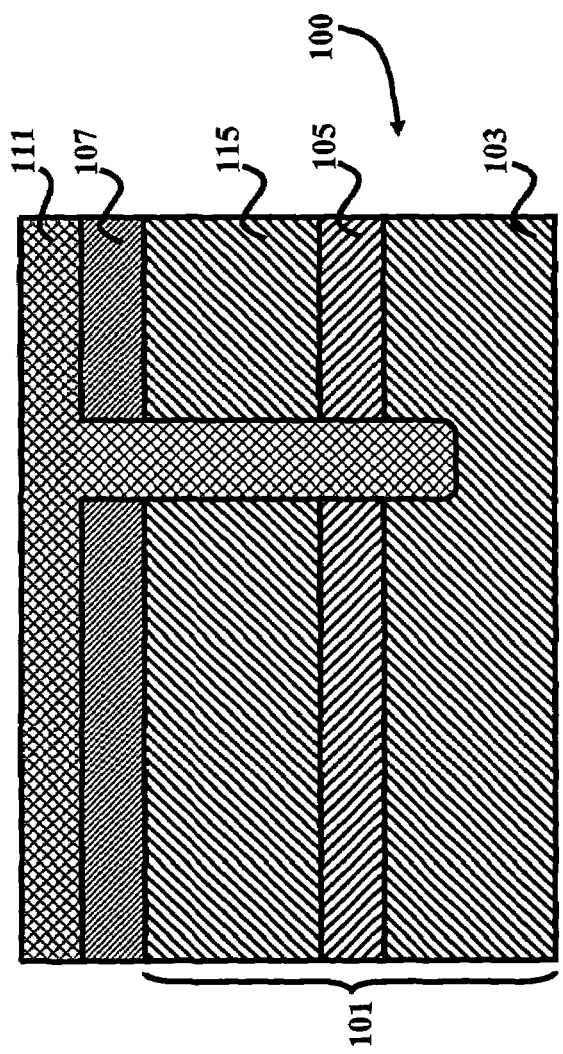
FIG. 3 is a cross-sectional view illustrating a third intermediate processing step of an integrated circuit device according to an embodiment of the invention.

In one embodiment, the substrate 103 comprises a single-crystal silicon layer. Alternatively, the substrate 103 may comprise any appropriate semiconducting material, including, but not limited to silicon (Si), germanium (Ge), gallium phosphide (GaP), indium arsenide (InAs), indium phosphide (InP), silicon germanium (SiGe), gallium arsenide (GaAs), or other III/V compounds. In order to prevent inversion of the substrate 103, a portion of the substrate 103 comprises lightly doped retrograde well regions 104, 106. Additionally, heavier doped retrograde well regions 108, 110 are also formed in the substrate 103. Those skilled in the art would readily understand that the well regions 104, 106, 108, 110 may be embodied as corresponding Nwell and/or Pwell regions. Moreover, the retrograde well regions 104, 106, 108, 110 may be formed using any well-known technique such as high-energy ion implantation and annealing. Moreover, those skilled in the art would understand that the retrograde well regions 104, 106, 108, 110 remain in the subsequent processing steps, but in order to not obscure the other pertinent features provided by the embodiments of the invention, the retrograde well regions 104, 106, 108, 110 are not shown in FIGS. 2 through 11, although they exist in the structures illustrated in those figures as well. A typical dose for the lightly doped well is approximately $1\times10^{14}$ to $5\times10^{15}$ per $cm^3$ and for the heavier doped well the dose is approximately $3\times10^{17}$ to $8\times10^{18}$ per $cm^3$. As shown in FIG. 2, a hardmask film 107 is deposited over the silicon layer 115. Then, a suitable directional etch is performed where a portion of the hardmask film 107, silicon layer 115, buried isolation layer 105, and underlying substrate 103 are removed by etching thereby forming a narrow gap 109 in the device 100. Next, FIG. 3 illustrates the IC device 100 after a dielectric layer 111 is deposited over the hardmask film 107 including filling the gap 109. The dielectric layer 111 shall form what will eventually become a shallow trench isolation (STI) region 111 (illustrated more particularly in FIG. 4) to provide electrical isolation between various devices in the integrated circuit 100.

Figure 4:
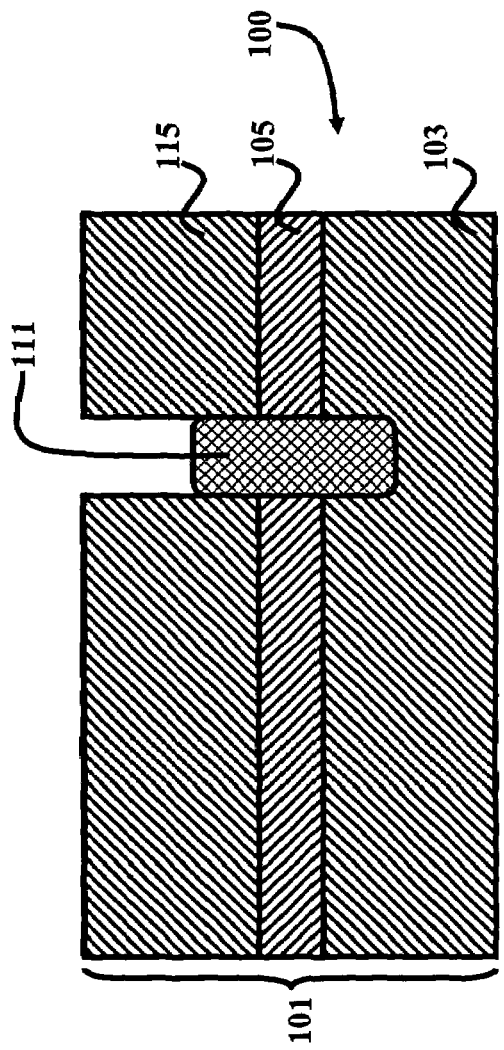
FIG. 4 is a cross-sectional view illustrating a fourth intermediate processing step of an integrated circuit device according to an embodiment of the invention.
Figure 5:
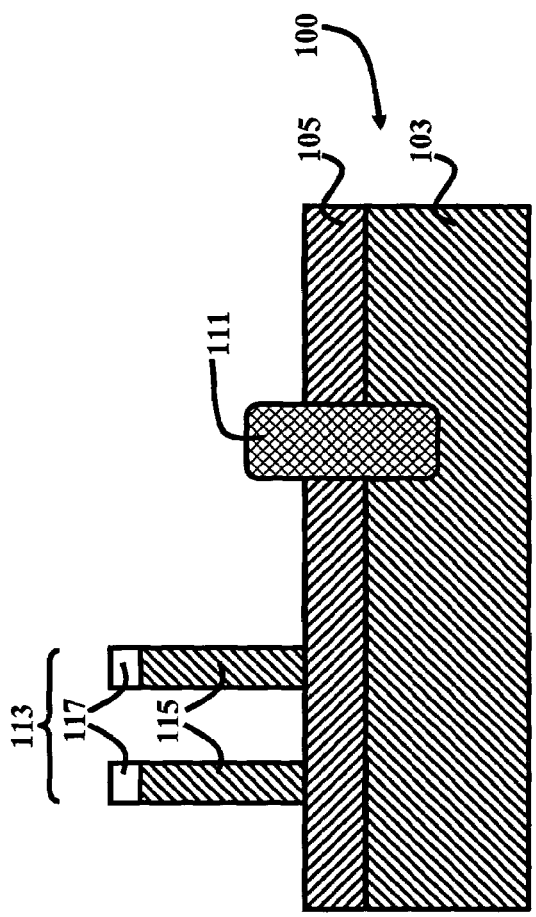
FIG. 5 is a cross-sectional view illustrating a fifth intermediate processing step of an integrated circuit device according to an embodiment of the invention.
Figure 6:
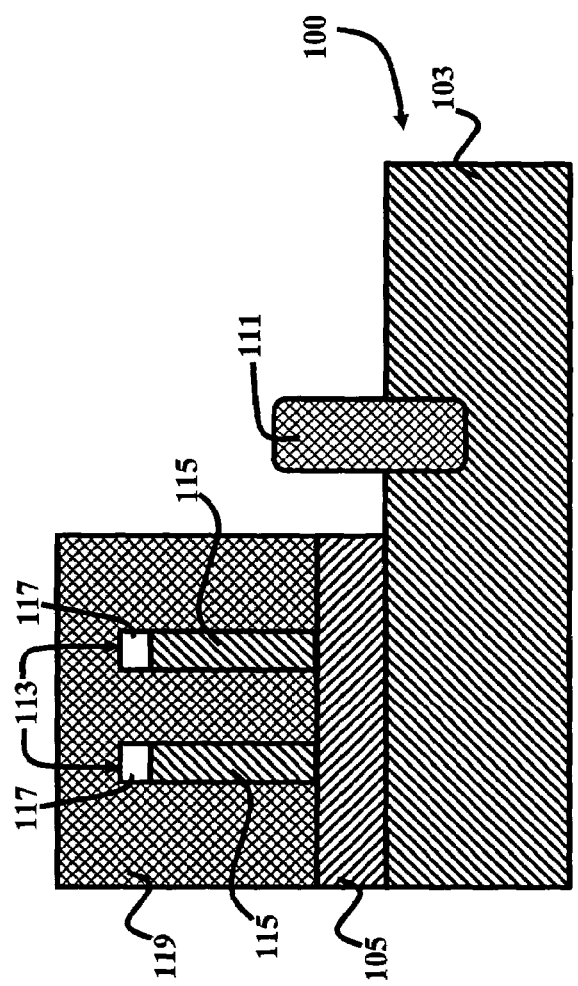
FIG. 6 is a cross-sectional view illustrating a sixth intermediate processing step of an integrated circuit device according to an embodiment of the invention.
Figure 7:
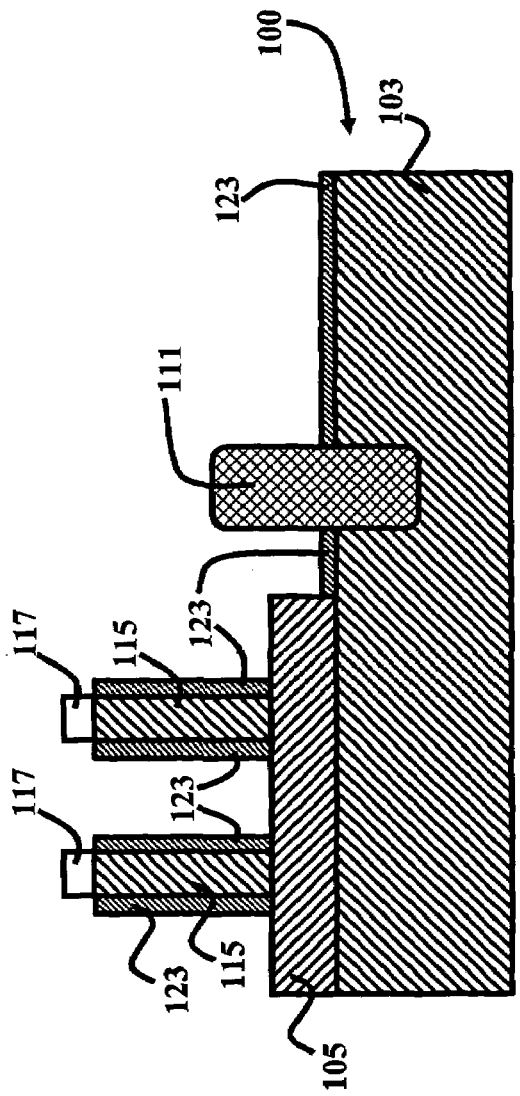
FIG. 7 is a cross-sectional view illustrating a seventh intermediate processing step of an integrated circuit device according to an embodiment of the invention.

As shown in FIG. 4 the hardmask film 107 and excess dielectric layer 111 are then stripped away by a suitable chemical process, thereby forming the recessed STI region 111. The STI region 111 is incorporated into the integrated circuit 100 according to a first embodiment of the invention. However, an integrated circuit 102 according to a second embodiment of the invention (as illustrated in FIGS. 9 through 11) may be constructed without a STI region. Thus, the processing steps involving the formation of the STI region 111 including deposition of the hardmask film 107, the subsequent etching and deposition of the dielectric layer 111 are not included in the fabrication of the second embodiment of the invention. Next, as illustrated in FIG. 5, a dielectric cap layer 117 is deposited, masked, and etched. Moreover, the silicon layer 115 is etched using this hardmask film 117. Collectively, the silicon layer 115 and the dielectric layer 117 form the fin structures 113. Thereafter, a resist layer 119 is masked to expose a portion of the buried isolation layer 105 and protect the fin structures 113 as shown in FIG. 6. Film 119 preferably comprises a resist image, which is masked and exposed to allow etching of the buried isolation layer 105. Then, an etching process occurs whereby portions of the buried isolation layer 105 unprotected (i.e., the planar area of the device 100) by the film 119 are removed, thereby exposing the underlying substrate 103. After the film 119 is stripped away by a suitable chemical process, a thin dielectric layer 123 (for example, approximately 10-40 Å thick), which may comprise nitride, is thermally grown over the device 100, as illustrated in FIG. 7, and more specifically over the silicon layer 115, dielectric layer 117, all exposed areas of the silicon substrate 103, and source/drain junctions 121 (shown in FIG. 8). The dielectric layer 123 surrounding the silicon layer 115 acts as a gate dielectric for the fin structures 113, and the dielectric layer 123 over the substrate 103 acts as a gate dielectric 123.

Figure 8:
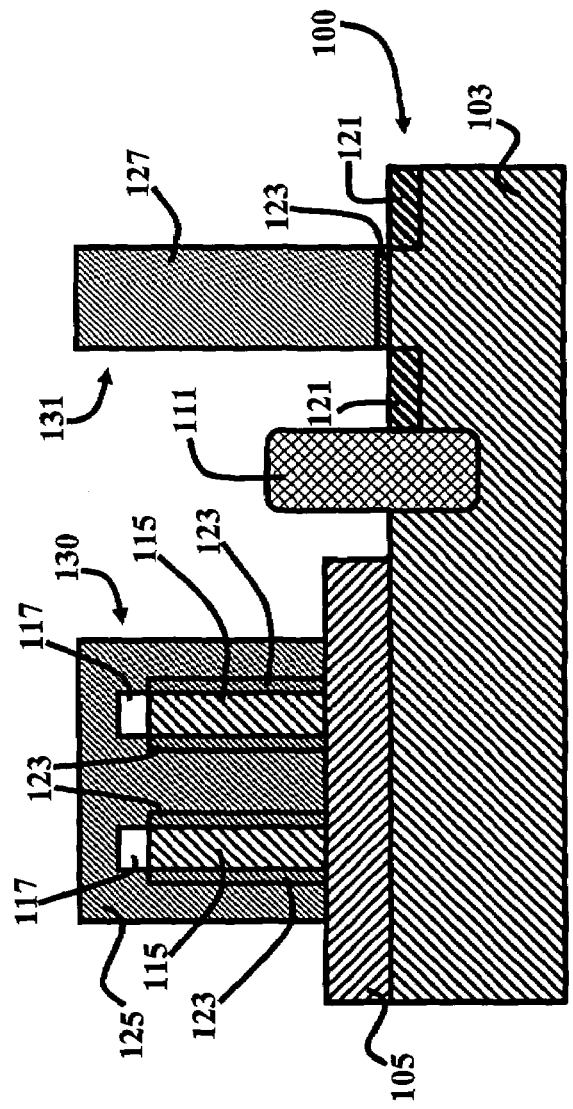
FIG. 8 is a cross-sectional view of a generally completed integrated circuit device according to a first embodiment of the invention.

FIG. 8 illustrates a first embodiment of the device 100 after a gate material 125, 127 preferably comprising polysilicon or silicon germanium material is deposited over the device 100. The device 100 then undergoes a chemical mechanical polishing (CMP) process to planarize the gate material 125, 127 in one step, thereby eliminating multiple processing steps, such that the FET gate 127 and the FinFET gate 125 are configured to a similar height. The FET and FINFET gates 127, 125, respectively, are then patterned using known lithography techniques and etched, whereby portions of the gate material 125, 127 are selectively removed by a reactive ion etching (RIE) process to form the FinFET gate electrode 125 and the FET gate electrode 127. Additionally, exposed areas of the dielectric layer 123 are also removed during the etching process.

Source/drain implant junctions 121 (with a channel region (not shown) therebetween) are also formed in the substrate 103. Likewise, source/drain implant junctions 122 (with a channel region (not shown) therebetween) are also formed on opposite sides of the FinFET gate 125 at the same time as the formation of the source/drain implant junctions 121 in the substrate 103. The source/drain implant junctions 122 are best seen in FIGS. 10 and 11 corresponding to the second embodiment of the invention, with a similar configuration provided for the first embodiment as well. The formation of the source/drain junctions 121, 122 may occur at any suitable point of the fabrication sequence. Furthermore, the formation of the source/drain junctions 121, 122 may be accomplished using any known methods that are tailored for specific performance requirements. As such, there are many such methods for forming the source/drain junctions 121, 122 having various levels of complexity. In some embodiments of the invention, the source/drain junctions 121, 122 may be lightly doped and formed using ion implantation. For example, for NFETs, usually phosphorus (P), arsenic (As), antimony (Sb), or other suitable material may be used for the source/drain implants 121, 122 in the range of 1 to 5 keV and a dose of $5\times10^{14}$ to $2\times10^{15}$ $cm^{-2}$. Likewise, for PFETs, usually boron (B), indium (In), gallium (Ga), or other suitable material may be used for the source/drain implants 121, 122 in the range of 0.5 to 3 keV and dose of $5\times10^{14}$ to $2\times10^{15}$ $cm^{-2}$.

Furthermore, in other embodiments of the invention, extension and halo implants (not shown) may be formed to improve short channel effects (SCE). For NFETs, usually boron (B), indium (In), gallium (Ga), or other suitable materials may be used for the halo implants with energies in the range of 5 to 15 keV and a dose of $1\times10^{13}$ to $8\times10^{13}$ $cm^{-2}$. Likewise, for PFETs, usually phosphorus (P), arsenic (As), antimony (Sb), or other suitable materials may be used for the halo implants with energies in the range of 20 to 45 keV and a dose of $1\times10^{13}$ to $8\times10^{13}$ $cm^{-2}$.

FIGS. 9 through 11 illustrate a second embodiment of the device 100 after the gate electrode 125 and FET gate electrode 127 are formed. Again, the difference between the first and second embodiments is that the device 100 of first embodiment includes a raised STI region 111, while the device 102 of the second embodiment does not include a trench isolation region. The gate material 125, 127 is deposited over the planar area 131 (area where the buried isolation layer 105 is removed) and FINFET regions 130 and is etched in both regions with one etch. Thus, the fabrication technique provided by the embodiments of the invention require only minor modification to the general SOI FINFET process and results in an easy to manufacture process with negligible gate step height difference in the FET structure 131 and FinFET structure 130. While FIGS. 10 and 11 are specifically illustrative of the second embodiment, those skilled in the art would readily understand that FIGS. 10 and 11 provide alternate views of the first embodiment as well, except without the inclusion of the STI region 111 provided in the first embodiment. Moreover, the dashed line AA-AA' in FIG. 11 provides the demarcation of the cross-sectional view of FIG. 9.

After the formation of the FET structure 131 and FinFET structure 130, the devices 100, 102 undergo conventional processing for formation of the remaining integrated circuit structures including interconnects, contacts, wiring layers, etc. (not shown), which are formed above the device level. Furthermore, several damascene layers (not shown) may be formed over the devices 100, 102 in accordance with conventional manufacturing techniques. The structures illustrated in FIGS. 1 through 11 achieve better thermal control of sensitive devices by placing such devices in the substrate 103 versus in the region above the buried isolation layer 105, which is contrary to conventional approaches. Moreover, analog and ESD devices benefit by this improved thermal control. Devices built in the substrate 103 also can support substrate biasing for improved power management. Furthermore, the processing of the structure shown in FIGS. 1 through 11 are much less complex and can be performed at a reduced cost while providing greater thermal control than conventional devices and processes.

Figure 12:
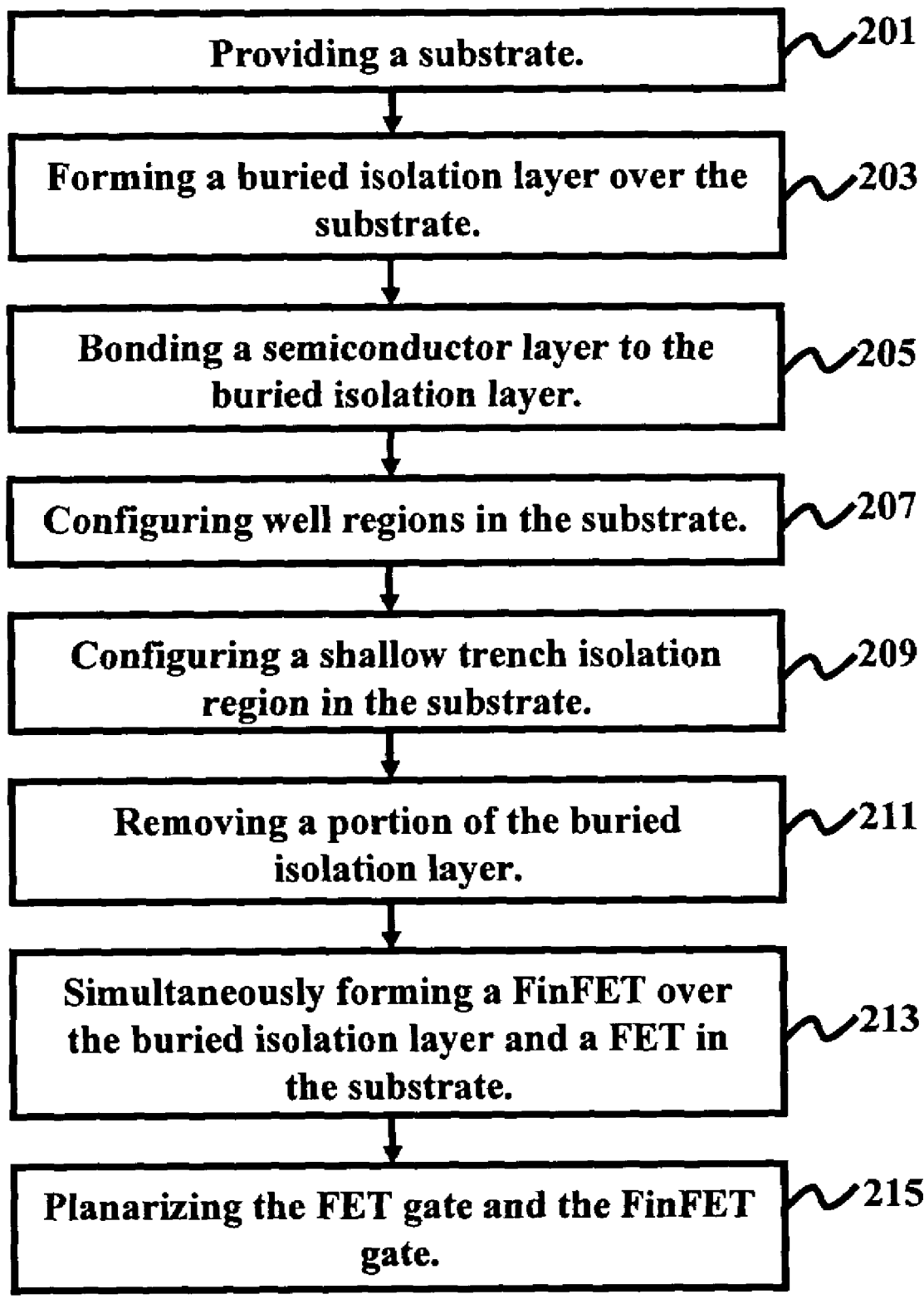
FIGS. 12 through 14 are flow diagrams illustrating preferred methods of an embodiment of the invention.
Figure 13:
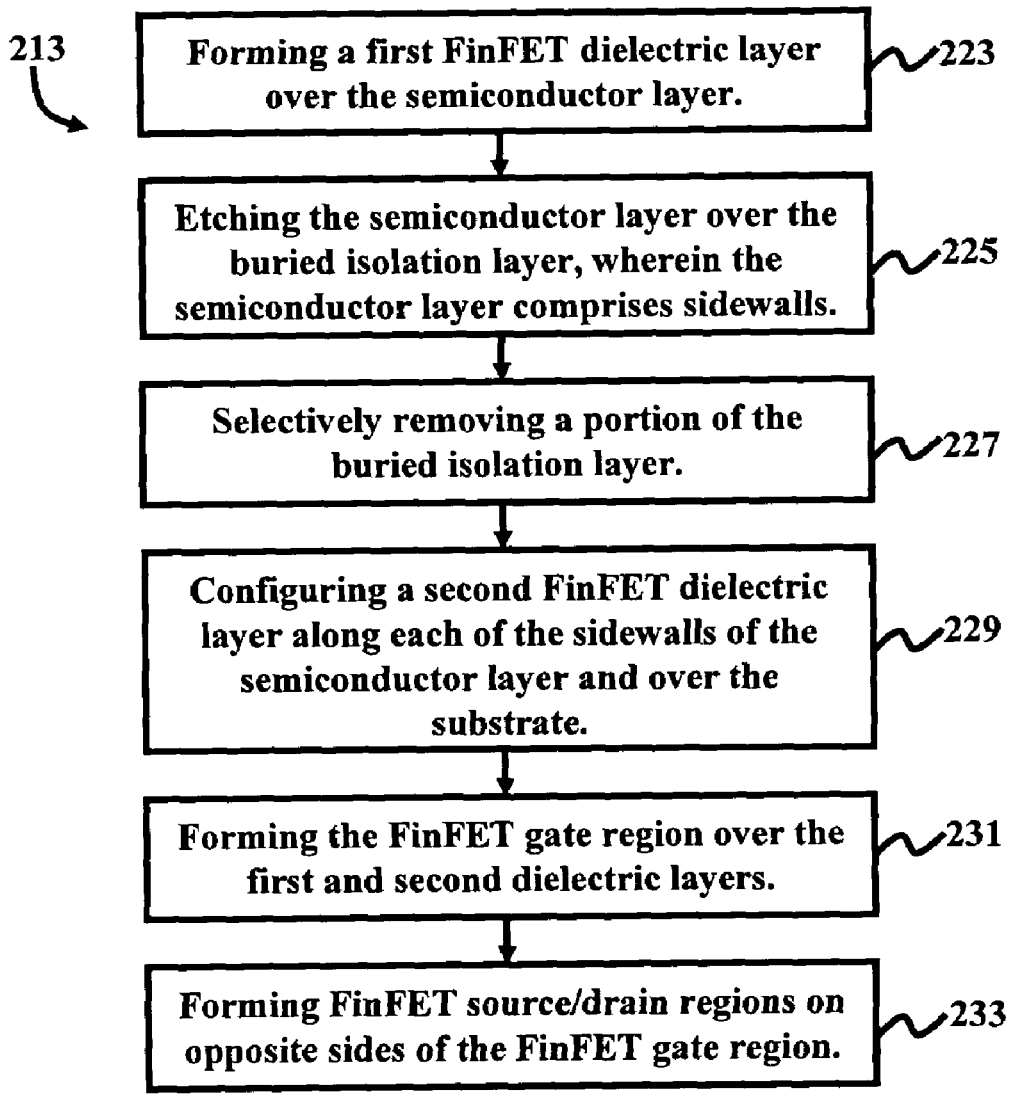
Figure 14:
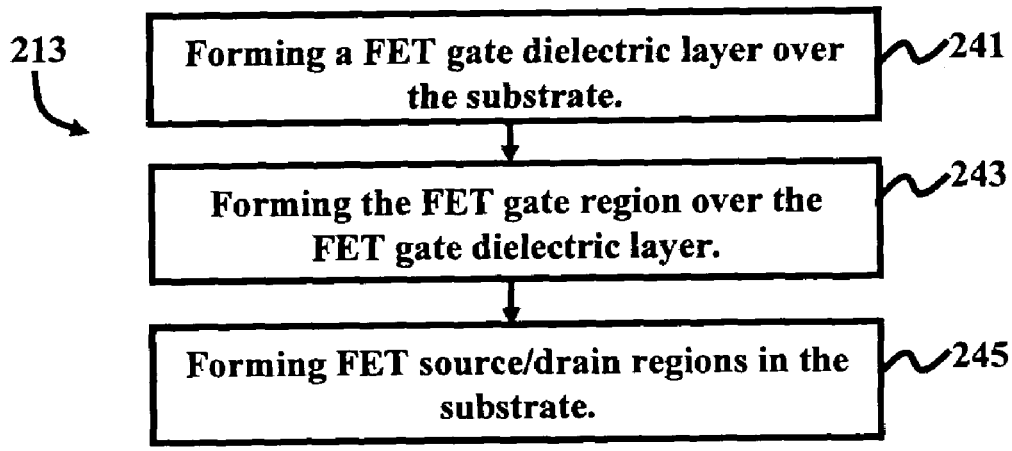

Another embodiment of the invention is illustrated in the flowcharts of FIGS. 12 through 14, which include descriptions that refer to components illustrated in FIGS. 1 through 11, whereby FIG. 12 depicts a method of forming an integrated circuit 100, wherein the method comprises providing (201) a substrate 103; forming (203) a buried isolation layer 105 over the substrate; and bonding (205) a semiconductor layer 115 to the buried isolation layer 105. The next steps of the method include configuring (207) well regions 104, 106, 108, 110 in the substrate 103, optionally configuring (209) a STI region 111 in the substrate 103, removing (211) a portion of the buried isolation layer 105, and simultaneously forming (213) a FinFET 130 over the buried isolation layer 105 and a FET 131 in the substrate 103. Thereafter, the method includes planarizing (215) the FET gate 127 and the FinFET gate 125. In one embodiment, the buried insulator layer 105 is formed of buried oxide.

As shown in the flowchart of FIG. 13, the process of forming (213) the FinFET 130 comprises forming (223) a first FinFET dielectric layer 117 over the semiconductor layer 115, etching (225) the semiconductor layer 115 over the buried isolation layer 105, wherein the semiconductor layer 115 comprises sidewalls; selectively removing (227) a portion of the buried isolation layer, configuring (229) a second FinFET dielectric layer 123 along each of the sidewalls of the semiconductor layer 115 and over the substrate 103, forming (231) the FinFET gate region 125 over the first and second dielectric layers 117, 123; and forming (233) FinFET source/drain regions 122 on opposite sides of the FinFET gate region 125.

As shown in flowchart of FIG. 14, the process of forming (213) the FET 131 (which occurs contemporaneously with the formation of the FinFET 130) comprises forming (241) a FET gate dielectric layer 123 over the substrate 103; forming (243) the FET gate region 127 over the FET gate dielectric layer 123, wherein the FET gate dielectric layer 123 is adjacent to the FET gate region 127; and forming (245) FET source/drain regions 121 in the substrate 103. Moreover, the FET gate dielectric layer 123 is formed between the FET gate region 127 and the substrate 103. Additionally, each of the FinFET gate region 125 and FET gate region 127 comprises polysilicon.

The integration of planar IC devices 131 in the substrate 103 with FinFET SOI devices 130 may be used to create many types of IC devices including logic gates, memory cells, analog circuits, ESD devices, capacitors, resistors, etc. Another advantage afforded by the embodiments of the invention is the capability for thermal control of key devices by building them in the substrate 103 as planar devices 131.

Generally, the embodiments of the invention provide a structure 100, 102 comprising a substrate 103, a buried isolation layer 105 over the substrate 103, a FinFET 130 over the buried isolation layer 105, and a FET 131 integrated in the substrate 103, wherein the FET gate 127 is planar to the FinFET gate 125. The embodiments of the invention provide an easy to implement integration technique whereby the planar logic integrated circuit devices 130 are incorporated with the FinFET devices 131 and are formed such that the FET gate 127 and FinFET gate 125 are formed in one manufacturing step. For example, the deposition of the FET gate material 127 and FinFET gate material 125 occur at the same time, and the planarization of the FET gate material 127 and FinFET gate material 125 occur at the same time. The FET gate 127 and FinFET gate 125 are planarized to the same upper height, which obviates the need for additional lithography and etching processes, thereby reducing the number of manufacturing steps resulting in an overall reduction in manufacturing cost.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A method of simultaneously forming a planar field effect transistor (FET) and a fin field effect transistor (FinFET) in an integrated circuit (IC), said method comprising:
   providing a substrate;
   forming a buried isolation layer above said substrate;
   bonding a semiconductor layer to said buried isolation layer;
   simultaneously forming a gate of said FinFET over said buried isolation layer in a FinFet region of said IC and a gate of said planar FET over said substrate in a planar region of said IC.

2. The method of claim 1, all the limitations of which are incorporated herein by reference, further comprising configuring well regions in at least one of said FinFet region and said planar region in said substrate.

3. The method of claim 1, all the limitations of which are incorporated herein by reference, wherein said forming of said FinFET comprises:
   forming a first FinFET dielectric layer over said semiconductor layer, wherein said semiconductor layer comprises sidewalls;
   configuring a second FinFET dielectric layer along each of said sidewalls of said semiconductor layer and over said substrate;
   forming said FinFET gate region over the first and second FinFET dielectric layers; and
   forming FinFET source/drain regions on opposite sides of said FinFET gate region.

4. The method of claim 1, all the limitations of which are incorporated herein by reference, wherein said forming of said planar FET comprises:
   forming a planar FET gate dielectric layer over said substrate;
   forming a planar FET gate region over said planar FET gate dielectric layer, wherein said planar FET gate dielectric layer is adjacent to said planar FET gate region; and
   forming planar FET source/drain regions in said substrate.

5. The method of claim 4, all the limitations of which are incorporated herein by reference, wherein said planar FET gate dielectric layer is formed between said planar FET gate region and said substrate.

6. The method of claim 1, all the limitations of which are incorporated herein by reference, further comprising configuring a shallow trench isolation region in said substrate.

7. The method of claim 1, all the limitations of which are incorporated herein by reference, wherein said FinFET gate region is formed of polysilicon.

8. The method of claim 1, all the limitations of which are incorporated herein by reference, wherein said planar FET gate region is formed of polysilicon.

9. The method of claim 1, all the limitations of which are incorporated herein by reference, wherein said buried insulator layer is formed of buried oxide.

10. The method of claim 1, all the limitations of which are incorporated herein by reference, further comprising simultaneously planarizing said gate of said FinFET and said gate of said planar FET.

11. A method of simultaneously forming a planar field effect transistor (FET) and a fin field effect transistor (FinFET) in an integrated circuit (IC), said method comprising:
providing a substrate;
forming a buried isolation layer above said substrate;
bonding a semiconductor layer to said buried isolation layer;
forming silicon fins in a FinFET region of said IC; and
simultaneously forming a gate of said FinFET over said buried isolation layer in a FinFet region of said IC and a gate of said planar FET over said substrate in a planar region of said IC.

12. The method of claim 11, all the limitations of which are incorporated herein by reference, further comprising configuring well regions in at least one of said FinFet region and said planar region in said substrate.

13. The method of claim 11, all the limitations of which are incorporated herein by reference, wherein said forming of said FinFET comprises:
forming a first FinFET dielectric layer over said semiconductor layer, wherein said semiconductor layer comprises sidewalls;
configuring a second FinFET dielectric layer along each of said sidewalls of said semiconductor layer and over said substrate;
forming said FinFET gate region over the first and second FinFET dielectric layers; and
forming FinFET source/drain regions on opposite sides of said FinFET gate region.

14. The method of claim 11, all the limitations of which are incorporated herein by reference, wherein said forming of said planar FET comprises:
forming a planar FET gate dielectric layer over said substrate;
forming a planar FET gate region over said planar FET gate dielectric layer, wherein said planar FET gate dielectric layer is adjacent to said planar FET gate region; and
forming planar FET source/drain regions in said substrate.

15. The method of claim 14, all the limitations of which are incorporated herein by reference, wherein said planar FET gate dielectric layer is formed between said planar FET gate region and said substrate.

16. The method of claim 11, further comprising simultaneously planarizing said gate of said FinFET and said gate of said planar FET.

17. A method of simultaneously forming a planar field effect transistor (FET) and a fin field effect transistor (FinFET) in an integrated circuit (IC), said method comprising:
providing a substrate;
forming a buried isolation layer above said substrate;
bonding a semiconductor layer to said buried isolation layer;
forming silicon fins in a FinFET region of said IC; and
forming shallow trench isolation structures between said FinFET region of said IC and a planar region of said IC;
simultaneously forming a gate of said FinFET over said buried isolation layer in said FinFet region of said IC and a gate of said planar FET over said substrate in said planar region of said IC.

18. The method of claim 17, all the limitations of which are incorporated herein by reference, further comprising configuring well regions in at least one of said FinFet region and said planar region in said substrate.

19. The method of claim 17, all the limitations of which are incorporated herein by reference, wherein said forming of said FinFET comprises:
forming a first FinFET dielectric layer over said semiconductor layer, wherein said semiconductor layer comprises sidewalls;
configuring a second FinFET dielectric layer along each of said sidewalls of said semiconductor layer and over said substrate;
forming said FinFET gate region over the first and second FinFET dielectric layers; and
forming FinFET source/drain regions on opposite sides of said FinFET gate region.

20. The method of claim 17, all the limitations of which are incorporated herein by reference, wherein said forming of said planar FET comprises:
forming a planar FET gate dielectric layer over said substrate;
forming a planar FET gate region over said planar FET gate dielectric layer, wherein said planar FET gate dielectric layer is adjacent to said planar FET gate region; and
forming planar FET source/drain regions in said substrate.

* * * * *